(12) United States Patent
Miura et al.

(10) Patent No.: US 10,186,435 B2
(45) Date of Patent: Jan. 22, 2019

(54) CHEMICAL LIQUID PREPARATION METHOD OF PREPARING A CHEMICAL LIQUID FOR SUBSTRATE PROCESSING, CHEMICAL LIQUID PREPARATION UNIT PREPARING A CHEMICAL LIQUID FOR SUBSTRATE PROCESSING, AND SUBSTRATE PROCESSING SYSTEM

(71) Applicant: SCREEN Holdings Co., Ltd., Kyoto (JP)

(72) Inventors: Atsuyasu Miura, Kyoto (JP); Hidekazu Ishikawa, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/630,387

(22) Filed: Jun. 22, 2017

(65) Prior Publication Data
US 2017/0294323 A1    Oct. 12, 2017

Related U.S. Application Data

(62) Division of application No. 13/835,073, filed on Mar. 15, 2013.

(30) Foreign Application Priority Data

May 15, 2012  (JP) .................................. 2012-111758
Feb. 13, 2013 (JP) .................................. 2013-025312

(51) Int. Cl.
| | |
|---|---|
| *H01L 21/67* | (2006.01) |
| *B01F 1/00* | (2006.01) |
| *C09K 13/00* | (2006.01) |
| *B01F 5/06* | (2006.01) |
| *B01F 5/10* | (2006.01) |

(Continued)

(52) U.S. Cl.
CPC ........ *H01L 21/6708* (2013.01); *B01F 1/0038* (2013.01); *B01F 3/04503* (2013.01); *B01F 3/04737* (2013.01); *B01F 3/04744* (2013.01); *B01F 5/0614* (2013.01); *B01F 5/10* (2013.01); *B01F 5/102* (2013.01); *C09K 13/00* (2013.01); *H01L 21/30617* (2013.01); *H01L 21/67017* (2013.01); *H01L 21/67051* (2013.01);
(Continued)

(58) Field of Classification Search
USPC ............................................................ 216/2
See application file for complete search history.

(56) References Cited

U.S. PATENT DOCUMENTS

| | | | |
|---|---|---|---|
| 5,866,307 A | 2/1999 | Kiba et al. | 430/327 |
| 6,082,373 A | 7/2000 | Sakurai et al. | 134/1 |

(Continued)

FOREIGN PATENT DOCUMENTS

| | | |
|---|---|---|
| CN | 1811603 A | 8/2006 |
| CN | 101042987 A | 9/2007 |

(Continued)

*Primary Examiner* — Roberts P Culbert
(74) *Attorney, Agent, or Firm* — Ostrolenk Faber LLP

(57) ABSTRACT

A substrate processing system includes a chemical liquid preparation unit preparing a chemical liquid to be supplied to a substrate and a processing unit which supplies the chemical liquid, prepared by the chemical liquid preparation unit, to the substrate. The chemical liquid preparation unit supplies an oxygen-containing gas, containing oxygen gas, to a TMAH-containing chemical liquid, containing TMAH (tetramethylammonium hydroxide), to make the oxygen-containing gas dissolve in the TMAH-containing chemical liquid.

3 Claims, 7 Drawing Sheets

(51) Int. Cl.
*B01F 3/04* (2006.01)
*H01L 21/306* (2006.01)
(52) U.S. Cl.
CPC ............ *H01L 21/67253* (2013.01); *B01F 2003/04879* (2013.01); *B01F 2003/04921* (2013.01)

(56) References Cited

U.S. PATENT DOCUMENTS

| | | |
|---|---|---|
| 6,149,828 A | 11/2000 | Vaartstra ..................... 216/57 |
| 6,217,657 B1 | 4/2001 | Kiba et al. ................... 118/692 |
| 2003/0066549 A1 | 4/2003 | Noda ............................ 134/37 |
| 2003/0068579 A1 | 4/2003 | Takahashi et al. ........... 430/311 |
| 2004/0099602 A1 | 5/2004 | Ogawa ......................... 210/641 |
| 2005/0058944 A1 | 3/2005 | Takahashi et al. ........... 430/311 |
| 2005/0271985 A1 | 12/2005 | Miya et al. .................. 430/323 |
| 2007/0037099 A1 | 2/2007 | Takahashi et al. ........... 430/311 |
| 2007/0224547 A1 | 9/2007 | Kido ............................. 430/322 |
| 2007/0272355 A1 | 11/2007 | Kido ........................... 156/345.1 |
| 2009/0023231 A1 | 1/2009 | Ohmi et al. .................... 438/16 |
| 2010/0294306 A1 | 11/2010 | Mochizuki et al. ........... 134/1.3 |
| 2011/0030722 A1 | 2/2011 | Ida et al. ......................... 134/1 |
| 2011/0042281 A1 | 2/2011 | Tokoshima et al. ......... 210/96.1 |
| 2012/0329284 A1 | 12/2012 | Ohmi et al. .................. 438/753 |
| 2013/0306238 A1 | 11/2013 | Miura et al. ............. 156/345.11 |

FOREIGN PATENT DOCUMENTS

| | | |
|---|---|---|
| CN | 101379597 A | 3/2009 |
| JP | 10-144604 | 5/1998 |
| JP | 2000-279902 A | 10/2000 |
| JP | 2000-315670 A | 11/2000 |
| JP | 2002-100603 A | 4/2002 |
| JP | 2006-73945 A | 3/2006 |
| JP | 2009-260020 | 11/2009 |
| JP | 4723268 | 7/2011 |
| KR | 1998-0024624 A | 7/1998 |
| KR | 10-2010-0100841 A | 9/2010 |

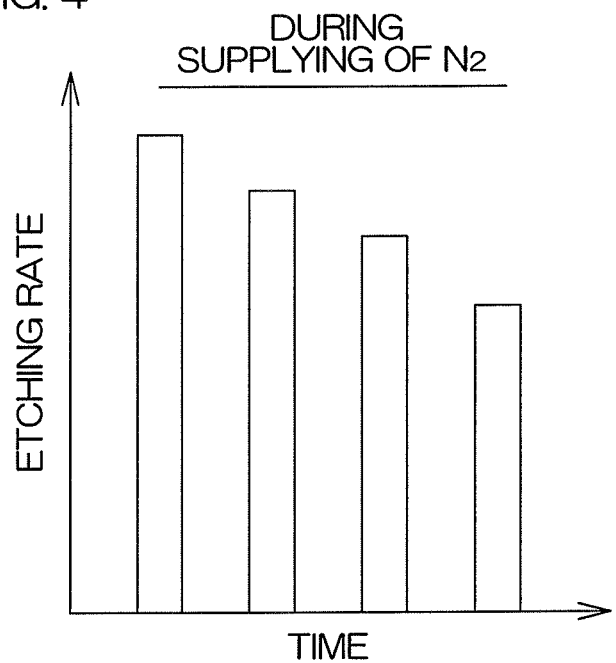
FIG. 4 DURING SUPPLYING OF $N_2$
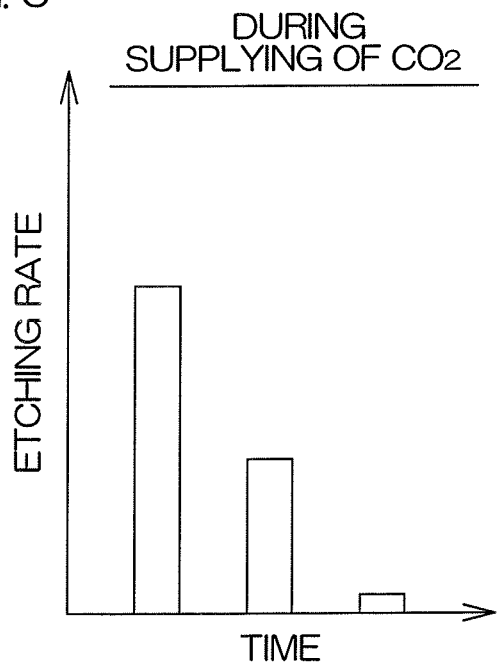
FIG. 5 DURING SUPPLYING OF $CO_2$

CHEMICAL LIQUID PREPARATION METHOD OF PREPARING A CHEMICAL LIQUID FOR SUBSTRATE PROCESSING, CHEMICAL LIQUID PREPARATION UNIT PREPARING A CHEMICAL LIQUID FOR SUBSTRATE PROCESSING, AND SUBSTRATE PROCESSING SYSTEM

CROSS REFERENCE TO RELATED APPLICATION

This application is a divisional of U.S. patent application Ser. No. 13/835,073, filed Mar. 15, 2013, which claims the benefit of Japanese Patent Application Nos. 2012-111758, filed May 15, 2012, and 2013-25312, filed Feb. 13, 2013, which are all incorporated herein by reference.

BACKGROUND OF THE INVENTION

1. Field of the Invention

The present invention relates to a chemical liquid preparation method and a chemical liquid preparation unit by which a chemical liquid to be supplied to a substrate is prepared. Further, the present invention relates to a substrate processing system including the chemical liquid preparation unit preparing a chemical liquid for substrate processing. Examples of the substrate to be processed include semiconductor wafers, substrates for liquid crystal display devices, substrates for plasma display devices, substrates for FED (Field Emission Display) devices, substrates for optical disks, substrates for magnetic disks, substrates for magnetooptical disks, substrates for photo masks, ceramic substrates, substrates for solar cells, etc.

2. Description of Related Art

In a manufacturing process for a semiconductor device or a liquid crystal display device, etc., a substrate processing apparatus that processes a substrate, such as a semiconductor wafer or glass substrate for liquid crystal display device, etc., is used. A substrate processing apparatus of a single substrate processing type described in Japanese Patent No. 4723268 includes a degas unit that decreases a dissolved oxygen amount in a chemical liquid supplied to a substrate and an inert gas supply line that supplies nitrogen gas into a chemical liquid tank storing the chemical liquid to be supplied to the substrate.

SUMMARY OF THE INVENTION

With the substrate processing apparatus according to Japanese Patent No. 4723268, the dissolved oxygen amount in the chemical liquid is decreased by deaeration to prevent oxidation of the substrate by the oxygen in the chemical liquid. Further, the substrate processing apparatus supplies nitrogen gas into the chemical liquid tank to prevent oxygen gas from dissolving into the chemical liquid inside the chemical liquid tank.

However, research by the present inventors has shown that there are cases where a processing ability of the chemical liquid is lowered by the supplying of nitrogen gas into the chemical liquid tank. Therefore an object of the present invention is to provide a chemical liquid preparation method and a chemical liquid preparation unit by which a chemical liquid having a stable processing ability can be prepared. Further, another object of the present invention is to provide a substrate processing system capable of suppressing variation in processing among substrates.

A preferred embodiment of the present invention provides a chemical liquid preparation method of preparing a chemical liquid for substrate processing. The chemical liquid preparation method includes a step of supplying an oxygen-containing gas that contains oxygen gas to a TMAH-containing chemical liquid that contains TMAH (tetramethylammonium hydroxide) to make the oxygen-containing gas dissolve in the TMAH-containing chemical liquid.

With this method of the preferred embodiment of the present invention, the oxygen-containing gas that contains oxygen gas is supplied to the TMAH-containing chemical liquid that contains TMAH. The chemical liquid to be supplied to a substrate is thereby prepared. Research by the present inventors has shown that when a nitrogen-containing gas that contains nitrogen gas is supplied to the TMAH-containing chemical liquid, a processing ability (for example, an etching amount per unit time) of the TMAH-containing chemical liquid decreases. On the other hand, it was found that when the oxygen-containing gas is supplied to the TMAH-containing chemical liquid, the processing ability of the TMAH-containing chemical liquid stabilizes. A chemical liquid for substrate processing that is stable in processing ability can thus be prepared by making the oxygen-containing gas dissolve in the TMAH-containing chemical liquid. Further, research by the present inventors has shown that when the oxygen-containing gas is supplied to the TMAH-containing chemical liquid that is decreased in processing ability, the processing ability of the TMAH-containing chemical liquid increases. The processing ability of the TMAH-containing chemical liquid can thus be recovered by making the oxygen-containing gas dissolve in the TMAH-containing chemical liquid.

In the preferred embodiment of the present invention, the chemical liquid preparation method of preparing a chemical liquid for substrate processing may include a measurement step of measuring a dissolved oxygen concentration in the TMAH-containing chemical liquid, a nitrogen dissolution step of supplying a nitrogen-containing gas containing nitrogen gas to the TMAH-containing chemical liquid to make the nitrogen-containing gas dissolve in the TMAH-containing chemical liquid when the dissolved oxygen concentration measured in the measurement step is higher than a predetermined concentration, and an oxygen dissolution step of supplying the oxygen-containing gas to the TMAH-containing chemical liquid to make the oxygen-containing gas dissolve in the TMAH-containing chemical liquid when the dissolved oxygen concentration measured in the measurement step is lower than the predetermined concentration.

With this method of the preferred embodiment of the present invention, the gas to be supplied to the TMAH-containing chemical liquid is switched according to the dissolved oxygen concentration in the TMAH-containing chemical liquid. That is, the dissolved oxygen concentration in the TMAH-containing chemical liquid is fed back to supply one of either the oxygen-containing gas or the nitrogen-containing gas to the TMAH-containing chemical liquid. Variation of the dissolved oxygen concentration in the TMAH-containing chemical liquid can thereby be suppressed. The chemical liquid for substrate processing that is uniform in dissolved oxygen concentration is thereby prepared.

Another preferred embodiment of the present invention provides a chemical liquid preparation unit preparing a chemical liquid for substrate processing including an oxygen dissolution unit which supplies an oxygen-containing gas that contains oxygen gas to a TMAH-containing chemical liquid that contains TMAH (tetramethylammonium hydroxide) to make the oxygen-containing gas dissolve in the TMAH-containing chemical liquid. With this arrangement of the preferred embodiment of the present invention, a chemical liquid for substrate processing that is stable in processing ability can be prepared and the processing ability of the TMAH-containing chemical liquid can be recovered by the oxygen-containing gas being dissolved in the TMAH-containing chemical liquid.

In the other preferred embodiment of the present invention, the chemical liquid preparation unit preparing a chemical liquid for substrate processing may include a measurement unit which measures a dissolved oxygen concentration in the TMAH-containing chemical liquid, a nitrogen dissolution unit which supplies a nitrogen-containing gas containing nitrogen gas to the TMAH-containing chemical liquid to make the nitrogen-containing gas dissolve in the TMAH-containing chemical liquid, and a controller which controls the nitrogen dissolution unit to make the nitrogen-containing gas dissolve in the TMAH-containing chemical liquid when the dissolved oxygen concentration measured by the measurement unit is higher than a predetermined concentration and controls the oxygen dissolution unit to make the oxygen-containing gas dissolve in the TMAH-containing chemical liquid when the dissolved oxygen concentration measured by the measurement unit is lower than the predetermined concentration. With this arrangement of the preferred embodiment of the present invention, the dissolved oxygen concentration in the TMAH-containing chemical liquid is fed back to supply one of either the oxygen-containing gas or the nitrogen-containing gas to the TMAH-containing chemical liquid. Variation of the dissolved oxygen concentration in the TMAH-containing chemical liquid can thereby be suppressed. The chemical liquid for substrate processing that is uniform in dissolved oxygen concentration is thus prepared.

Yet another preferred embodiment of the present invention provides a substrate processing system including the chemical liquid preparation unit and a processing unit which supplies the TMAH-containing chemical liquid, prepared by the chemical liquid preparation unit, to a substrate. With this arrangement of the preferred embodiment of the present invention, the TMAH-containing chemical liquid that is adjusted in dissolved oxygen concentration is supplied to the substrate. Variation in processing among the substrates can thus be suppressed.

The above and yet other objects, features, and effects of the present invention shall be made clear by the following description of the preferred embodiments in reference to the attached drawings.

BRIEF DESCRIPTION OF THE DRAWINGS

FIG. 4 is a graph of transition of an etching rate in a case where nitrogen gas is supplied into the tank.

FIG. 5 is a graph of transition of the etching rate in a case where carbon dioxide gas is supplied into the tank.

DETAILED DESCRIPTION OF PREFERRED EMBODIMENTS

Figure 1:
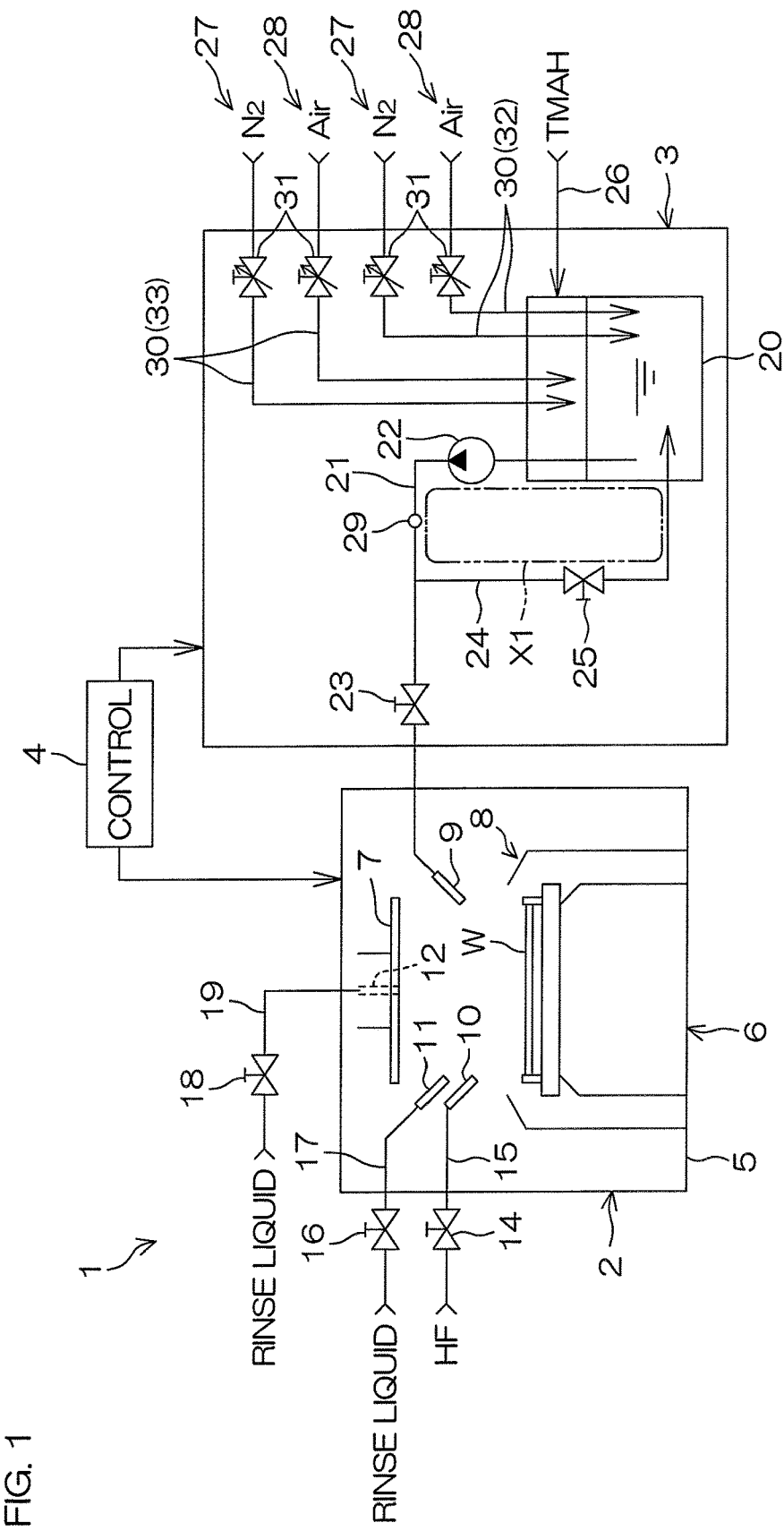
FIG. 1 is a schematic view of a substrate processing system according to a first preferred embodiment of the present invention.
Figure 2:
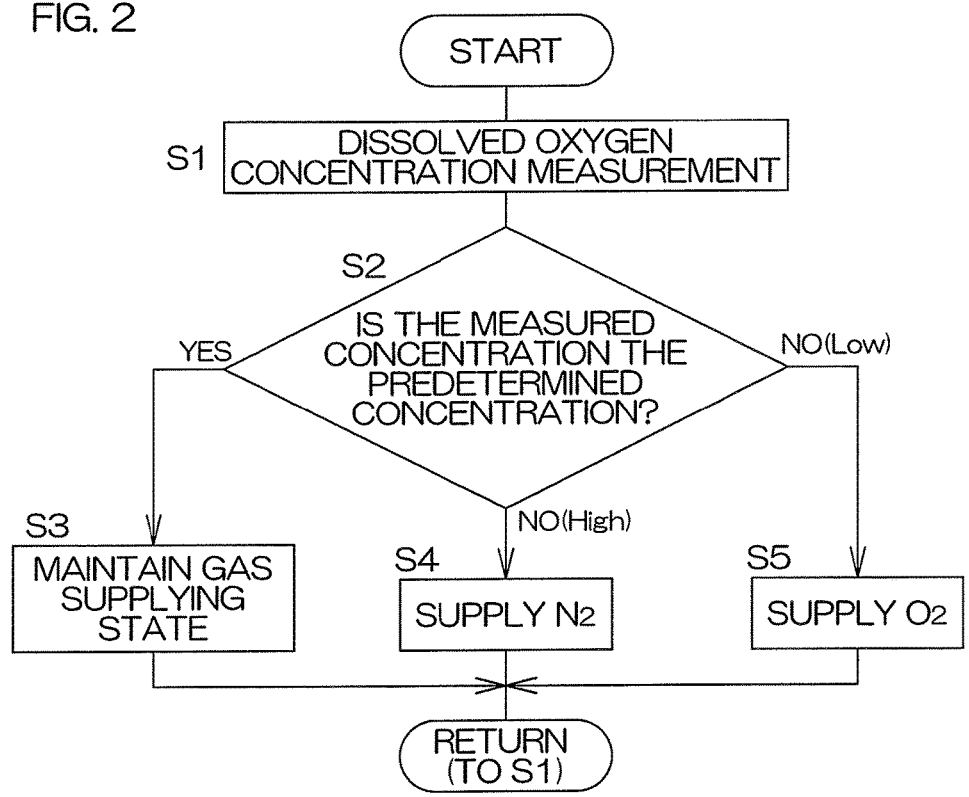
FIG. 2 is an example of a flow for adjusting a dissolved oxygen concentration in TMAH.

FIG. 1 is a schematic view of a substrate processing system 1 according to a first preferred embodiment of the present invention. FIG. 2 is an example of a flow for adjusting a dissolved oxygen concentration in TMAH.

As shown in FIG. 1, the substrate processing system 1 includes a processing unit 2 that processes a substrate W using processing liquids, such as a chemical liquid, rinse liquid, etc., a chemical liquid supplying unit 3 as a chemical liquid preparation unit that supplies TMAH, which is an example of a chemical liquid, to the processing unit 2, and a controller 4 that controls devices and opening and closing of valves included in the substrate processing system 1.

The processing unit 2 and the chemical liquid supplying unit 3 may be portions of an apparatus in common or may be mutually independent units (units that can be moved mutually independently). That is, the substrate processing system 1 may include a substrate processing apparatus including the processing unit 2 and the chemical liquid supplying unit 3 or may include a substrate processing apparatus including the processing unit 2 and the chemical liquid supplying unit 3 disposed at a position separated from the substrate processing apparatus.

Also, the processing unit 2 may be a single substrate processing type unit that processes a substrate W one by one or may be a batch type unit that processes a plurality of substrates W in a batch. FIG. 1 shows an example where the processing unit 2 is a single substrate processing type unit. The process performed at the processing unit 2 may be an etching process of supplying an etching liquid to the substrate W having a polysilicon film (poly-Si film) or other film to be processed formed on an outermost layer or may be a developing process of supplying a developing liquid to the substrate W after exposure. Obviously, a process other than the etching process and the developing process may be performed at the processing unit 2.

The processing unit 2 shown in FIG. 1 includes a box-shaped chamber 5, a spin chuck 6 that holds the substrate W horizontally inside the chamber 5 and rotates the substrate W around a vertical axis passing through a center of the substrate W, and processing liquid nozzles 9 to 12 discharging the processing liquids, such as a chemical liquid, rinse liquid, etc., toward the substrate W. Further, the processing unit 2 includes a disk-shaped shield plate 7 disposed horizontally above the spin chuck 6, a raising/lowering unit (not shown) that raises and lowers the shield plate 11, and a cylindrical cup 8 surrounding a periphery of the spin chuck 6. The processing liquid nozzles 9 to 12 include two chemical liquid nozzles (a first chemical liquid nozzle 9 and a second chemical liquid nozzle 10) that discharge chemical liquids toward an upper surface of the substrate W and two rinse liquid nozzles (a first rinse liquid nozzle 11 and a second rinse liquid nozzle 12) that discharge a rinse liquid toward the upper surface of the substrate W. The second rinse liquid nozzle 12 extends in an up/down direction along a central axis of the shield plate 7 and a discharge port, from which the rinse liquid is discharged downward from a central portion of a lower surface of the shield plate 7, is provided at a lower end portion of the second rinse liquid nozzle 12.

As shown in FIG. 1, the first chemical liquid nozzle 9 is connected to the chemical liquid supplying unit 3. The second chemical liquid nozzle 10 is connected to a second chemical liquid piping 15 having a second chemical liquid valve 14 interposed therein. The first rinse liquid nozzle 11 is connected to a first rinse liquid piping 17 having a first rinse liquid valve 16 interposed therein. The second rinse liquid nozzle 12 is connected to a second rinse liquid piping 19 having a second rinse liquid valve 18 interposed therein. TMAH (aqueous solution), which is an example of a chemical liquid, is supplied to the first chemical liquid nozzle 9, and hydrofluoric acid, which is an example of a chemical liquid, is supplied to the second chemical liquid nozzle 10. Pure water (deionized water), which is an example of a rinse liquid, is supplied to the first rinse liquid nozzle 11 and the second rinse liquid nozzle 12.

TMAH is an example of an organic alkali. TMAH is also an example of an etching liquid and a developing liquid. The TMAH to be supplied to the first chemical liquid nozzle 9 may contain a surfactant or does not have to contain a surfactant. Also, the chemical liquid supplied to the second chemical liquid nozzle 10 is not restricted to hydrofluoric acid and may be a liquid containing at least one among sulfuric acid, acetic acid, nitric acid, hydrochloric acid, hydrofluoric acid, ammonia water, hydrogen peroxide water, an organic acid (for example, citric acid or oxalic acid, etc.), an organic alkali, a surfactant, and a corrosion inhibitor. The rinse liquid to be supplied to the first rinse liquid nozzle 11 is not restricted to pure water and may be any of carbonated water, electrolyzed ion water, hydrogen water, ozone water, and aqueous hydrochloric acid of dilute concentration (for example, approximately 10 to 100 ppm), etc. The same applies to the rinse liquid supplied to the second rinse liquid nozzle 12.

At the processing unit 2, an etching process of successively supplying, for example, hydrofluoric acid, pure water, TMAH, and pure water in that order across the entire upper surface of the substrate W is performed. Specifically, the controller 4 rotates the substrate W around the vertical axis while holding the substrate W horizontally by means of the spin chuck 6. In this state, the controller 4 opens the second chemical liquid valve 14 to make hydrofluoric acid be discharged from the second chemical liquid nozzle 10 toward the upper surface of the substrate W. The hydrofluoric acid supplied to the substrate W spreads outward on the substrate W due to a centrifugal force due to the rotation of the substrate W and is discharged to a periphery of the substrate W from a outer peripheral portion of the upper surface of the substrate W. After stopping the discharge of hydrofluoric acid from the second chemical liquid nozzle 10, the controller 4 opens/closes the first rinse liquid valve 16 to make pure water be discharged from the first rinse liquid nozzle 11 toward the upper surface of the substrate W in the rotating state. The hydrofluoric acid on the substrate W is thereby rinsed off by the pure water.

Thereafter, the controller 4 controls the chemical liquid supplying unit 3 to make TMAH be discharged from the first chemical liquid nozzle 9 toward the upper surface of the substrate W in the rotating state. Thereafter, the controller 4 controls the raising/lowering unit to make the lower surface of the shield plate 7 approach the upper surface of the substrate W closely. In this state, the controller 4 opens/closes the second rinse liquid valve 18 to make pure water be discharged from the second rinse liquid nozzle 12 toward the upper surface of the substrate W in the rotating state. Subsequently, the controller 4 controls the raising/lowering unit to make the lower surface of the shield plate 7 approach the upper surface of the substrate W more closely. In this state, the controller 4 rotates the substrate W at high speed by means of the spin chuck 6 to dry the substrate W. The series of processes on the substrate W is thus performed.

As shown in FIG. 1, the chemical liquid supplying unit 3 includes a tank 20 storing TMAH, a first chemical liquid piping 21 guiding the TMAH inside the tank 20 to the processing unit 2 (first chemical liquid nozzle 9), a liquid feeding pump 22 feeding the TMAH inside the tank 20 to the first chemical liquid piping 21, and a first chemical liquid valve 23 that opens and closes an interior of the first chemical liquid piping 21. Further, the chemical liquid supplying unit 3 includes a circulation piping 24 connecting the first chemical liquid piping 21 and the tank 20 at a position further upstream (further toward the tank 20 side) than the first chemical liquid valve 23, a circulation valve 25 opening and closing an interior of the circulation piping 24, and a replenishing piping 26 replenishing TMAH from a chemical liquid supply source to the tank 20 when a liquid amount inside the tank 20 falls below a predetermined amount.

When the TMAH inside the tank 20 is to be supplied to the processing unit 2, the first chemical liquid valve 23 is opened and the circulation valve 25 is closed. In this state, the TMAH fed to the first chemical liquid piping 21 from the tank 20 by the liquid feeding pump 22 is supplied to the processing unit 2. On the other hand, when the supply of the TMAH to the processing unit 2 is stopped, the first chemical liquid valve 23 is closed and the circulation valve 25 is opened. In this state, the TMAH fed to the first chemical liquid piping 21 from the tank 20 by the liquid feeding pump 22 is returned into the tank 20 through the circulation piping 24. Therefore during supply stoppage, in which the supply of the TMAH to the processing unit 2 is stopped, the TMAH continues to be circulated around a circulation path X1 formed by the tank 20, the first chemical liquid piping 21, and the circulation piping 24. An unillustrated temperature adjusting mechanism (heating mechanism or cooling mechanism) is disposed in the circulation path X1 (circulation line) and a temperature of the TMAH supplied to the processing unit 2 is adjusted by the temperature adjusting mechanism.

As shown in FIG. 1, the chemical liquid supplying unit 3 includes a nitrogen dissolution unit 27 making nitrogen gas dissolve in the TMAH inside the tank 20 to increase a dissolved nitrogen concentration in the TMAH, an oxygen dissolution unit 28 making oxygen gas dissolve in the TMAH inside the tank 20 to increase a dissolved oxygen concentration in the TMAH, and a dissolved gas sensor 29 detecting the dissolved oxygen concentration in the TMAH. The dissolved gas sensor 29 may be a sensor that measures the dissolved oxygen concentration in the TMAH flowing through a piping, such as the first chemical liquid piping 21, etc., or may be a sensor that measures the dissolved oxygen concentration in the TMAH stored in the tank 20.

The nitrogen dissolution unit 27 supplies a nitrogen-containing gas, containing nitrogen gas, to the TMAH to make the nitrogen gas dissolve in the TMAH. The oxygen dissolution unit 28 supplies an oxygen-containing gas, containing oxygen gas, to the TMAH to make the oxygen gas dissolve in the TMAH. The nitrogen-containing gas may be nitrogen gas or may be a mixed gas of nitrogen gas and a gas besides nitrogen gas. Similarly, the oxygen-containing gas may be oxygen gas of which oxygen concentration is 100% or may be a mixed gas of oxygen gas and a gas besides oxygen gas. In the following, an example where the nitrogen-containing gas is nitrogen gas, which is an example of an inert gas, and the oxygen-containing gas is dry air (cleaned dry air), which contains nitrogen and oxygen at a proportion of approximately 8 to 2, shall be described. In a case where a gas may be either of the oxygen-containing gas and the nitrogen-containing gas and the type of gas is not questioned, it shall simply be referred to as "gas."

As shown in FIG. 1, the nitrogen dissolution unit 27 includes a gas piping 30 discharging the nitrogen gas into the tank 20 and a flow regulating valve 31 changing a flow rate of the gas discharged from the gas piping 30. Similarly, the oxygen dissolution unit 28 includes a gas piping 30 discharging the dry air into the tank 20 and a flow regulating valve 31 changing a flow rate of the gas discharged from the gas piping 30. Each gas piping 30 may be a bubbling piping 32 that discharges the gas from a discharge port disposed in the TMAH (in the liquid) to generate bubbles in the TMAH. Also, each gas piping 30 may be a purge piping 33 that discharges the gas from a discharge port disposed above a liquid level inside the tank 20 to make the gas inside the tank 20 be exhausted to an unillustrated exhaust pipe. In FIG. 1, an example where the bubbling piping 32 and the purge piping 33 are provided in each of the oxygen dissolution unit 27 and the oxygen dissolution unit 28 is shown.

By means of the nitrogen dissolution unit 27 and the oxygen dissolution unit 28, the controller 4 supplies at least one of either of the nitrogen gas and the dry air to the tank 20 at a flow rate corresponding to an opening degree of the flow regulating valve 31 to adjust the dissolved oxygen concentration in the TMAH to a fixed concentration. Specifically, the dissolved oxygen concentration in the TMAH is increased or decreased or maintained at the fixed concentration by the controller 4. The controller 4 controls the opening degree of the flow regulating valve 31 to adjust a supply flow rate of the nitrogen gas into the tank 20. Similarly, the controller 4 controls the opening degree of the flow regulating valve 31 to adjust a supply flow rate of the dry air into the tank 20.

The supplying of the gas (at least one of either of the nitrogen gas and the dry air) into the tank 20 may be performed when the TMAH is being supplied from the chemical liquid supplying unit 3 to the processing unit 2 (during chemical liquid supply), or may be performed when the supplying of the TMAH from the chemical liquid supplying unit 3 to the processing unit 2 is stopped (during the supply stoppage), or may be performed during the chemical liquid supply and during the supply stoppage. For example, the supplying of the dry air into the tank 20 may be performed over an entire period during the chemical liquid supply and during the supply stoppage. Or the nitrogen gas and the dry air may be supplied alternately into the tank 20. The gas supplied into the tank 20 is exhausted to an exterior of the tank 20 via an unillustrated exhaust line.

As shown in FIG. 1, the dissolved gas sensor 29 detects the dissolved oxygen concentration in the TMAH. A detection value of the dissolved gas sensor 29 is input into the controller 4. The controller 4 may control the supplying of the nitrogen gas and the dry air to the TMAH based on the detection value of the dissolved gas sensor 29. Specifically, as shown in FIG. 2, when the dissolved oxygen concentration in the TMAH is measured by the dissolved gas sensor 29 (step S1), the controller 4 judges, based on the detection value of the dissolved gas sensor 29, whether or not the measured dissolved oxygen concentration matches a predetermined concentration (step S2). If the measured dissolved oxygen concentration is the predetermined concentration (in a case of Yes at S2), the controller 4 keeps a supply state of the gas into tank 20 fixed (step S3).

On the other hand, if the dissolved oxygen concentration is higher than the predetermined concentration (in a case of NO (High) at S2), the controller 27 makes the nitrogen gas be supplied into the tank 20 by means of the nitrogen dissolution unit 27 (step S4). The dissolved oxygen concentration in the TMAH is thereby decreased to the predetermined concentration. Oppositely, if the dissolved oxygen concentration is lower than the predetermined concentration (in a case of NO (Low) at S2), the controller 4 makes the dry air be supplied into the tank 20 by means of the oxygen dissolution unit 28 (step S5). The dissolved oxygen concentration in the TMAH is thereby increased to the predetermined concentration. The dissolved oxygen concentration in the TMAH is then measured by the dissolved gas sensor 29 again (return to step S1). The dissolved oxygen concentration in the TMAH is thereby adjusted to an optimal concentration.

Figure 3:
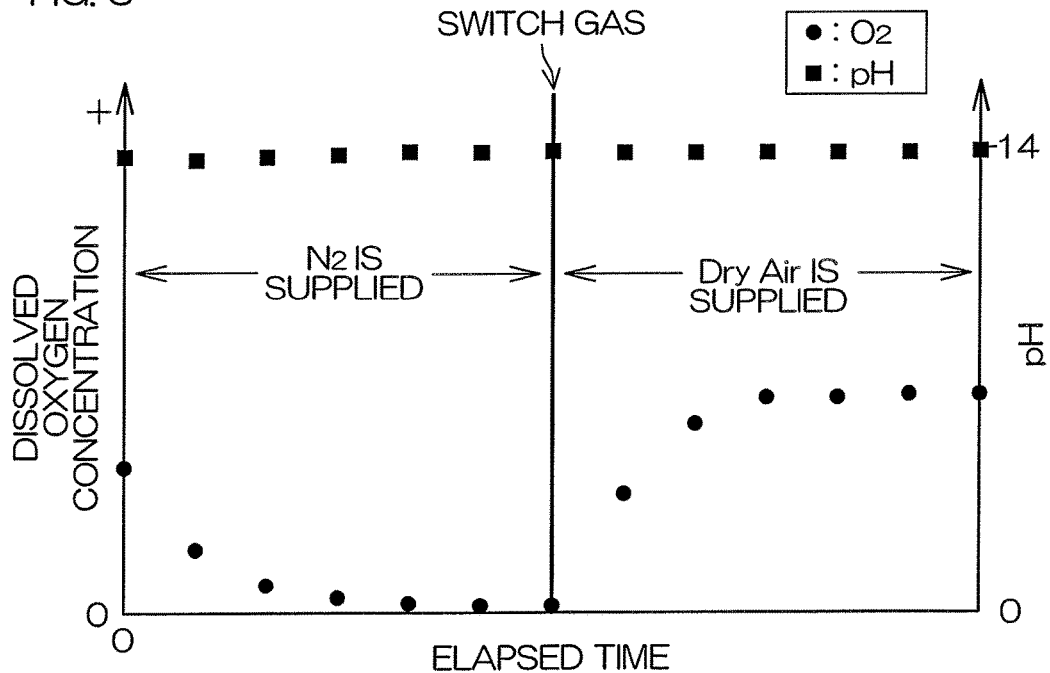
FIG. 3 is a graph of transition of the dissolved oxygen concentration in the TMAH when nitrogen gas and dry air are supplied into a tank in that order.
Figure 6:
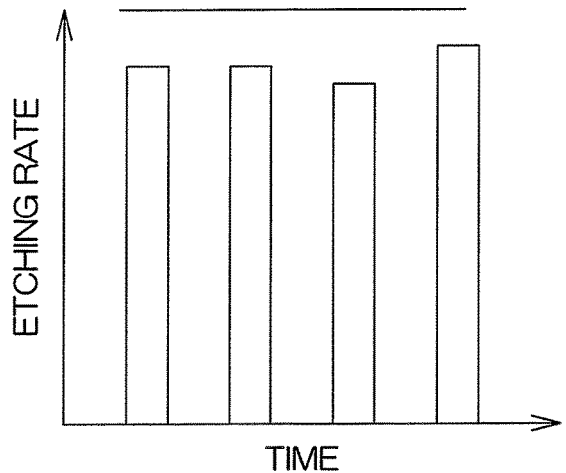
FIG. 6 is a graph of transition of the etching rate in a case where dry air is supplied into the tank.
Figure 7:
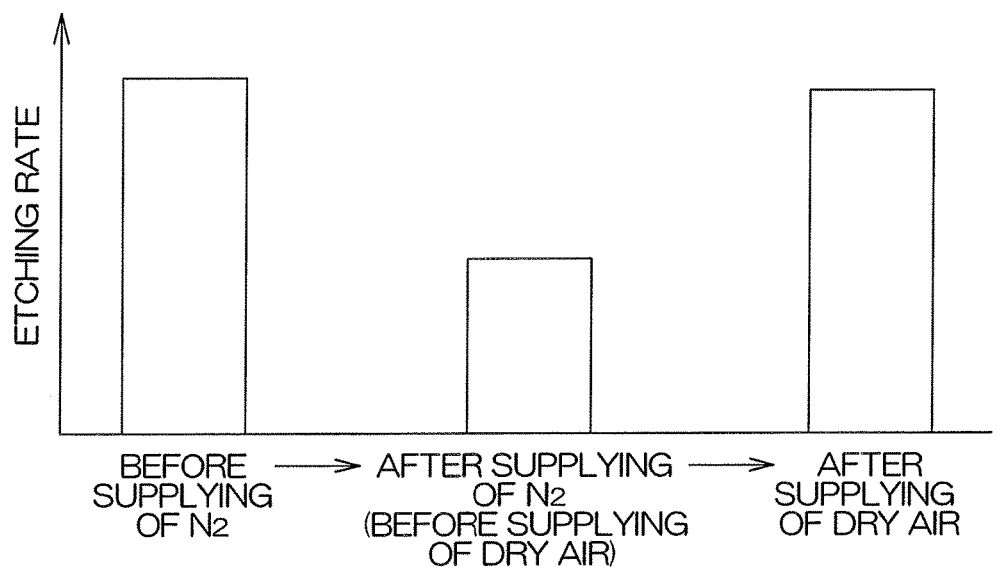
FIG. 7 is a graph of change of a processing ability of TMAH when dry air is supplied to TMAH that has been lowered in processing ability by supplying of nitrogen gas.

FIG. 3 is a graph of transition of the dissolved oxygen concentration in the TMAH when the nitrogen gas and the dry air are supplied into the tank 20 in that order. FIG. 4 is a graph of transition of an etching rate (etching amount per unit time) in a case where the nitrogen gas is supplied into the tank 20. FIG. 5 is a graph of transition of the etching rate in a case where carbon dioxide gas is supplied into the tank 20. FIG. 6 is a graph of transition of the etching rate in a case where the dry air is supplied into the tank 20. FIG. 7 is a graph of change of a processing ability (etching rate) of the TMAH when the dry air is supplied to the TMAH that has been lowered in processing ability by the supplying of the nitrogen gas.

FIG. 4 shows measurement values when a plurality of substrates W were processed at predetermined time intervals apart while supplying the nitrogen gas into the tank 20. FIG. 5 shows measurement values when a plurality of substrates W were processed at predetermined time intervals apart while supplying the carbon dioxide gas into the tank 20. FIG. 6 shows measurement values when a plurality of substrates W were processed at predetermined time intervals apart while supplying the dry air into the tank 20.

As shown in FIG. 3, when the supplying of the nitrogen gas to the TMAH is started, the dissolved oxygen concentration in the TMAH decreases rapidly and then stabilizes at a value (near 0) lower than that at the start of supplying of the nitrogen gas. When the gas supplied to the TMAH is thereafter changed to the dry air, the dissolved oxygen concentration in the TMAH rapidly increases to a value higher than at the start of supplying of the dry air and thereafter stabilizes at a value higher than that at the start of supplying of the nitrogen gas. In regard to a pH (hydrogen ion index) of the TMAH, the pH is stable at a substantially fixed value when either of the gases is being supplied to the TMAH.

When as shown in FIG. 4, the nitrogen gas is dissolved in the TMAH, the etching rate decreases gradually. When as shown in FIG. 5, the carbon dioxide gas is dissolved in the TMAH, the etching rate decreases gradually at a rate greater than that when the nitrogen gas is dissolved in the TMAH.

A reason why the etching rate decreases rapidly due to the supplying of the carbon dioxide gas is considered to be as follows.

That is, when the TMAH, which contains a hydroxyl group ($OH^-$), is supplied to a substrate W containing silicon (Si), the silicon is etched according to a reaction: "$Si+4OH^- \rightarrow Si(OH)_4$." That is, the hydroxyl group contributes to the etching of the silicon. On the other hand, when the carbon dioxide gas is supplied to the TMAH (aqueous solution), hydrogen ions ($H^+$) increase due to a reaction, "$CO_2 + H_2O \rightarrow H^+ + HCO_3^-$." The hydroxyl group contained in the TMAH bonds with the hydrogen ion and changes to $H_2O$. It is thus considered that the etching rate decreased rapidly due to the supplying of the carbon dioxide gas.

On the other hand, when the dry air is dissolved in the TMAH, the etching rate hardly changes as shown in FIG. 6. Also as shown in FIG. 7, when the dry air is dissolved in TMAH that has been lowered in processing ability (etching rate) due to the supplying of the nitrogen gas, the processing ability of the TMAH recovers.

The dry air is made up of approximately 80% nitrogen gas and approximately 20% oxygen gas and differs from the nitrogen gas in containing the oxygen gas. It is thus considered that the stability and recovery of the processing ability of the TMAH is brought about by oxygen. Further, the measurement results shown in FIG. 5 show that a lower concentration of carbon dioxide in the gas supplied to the TMAH is more preferable. That is, a lower concentration of carbon dioxide, which is an example of an acidic gas that generates hydrogen ions ($H^+$) by dissolving in water, is more preferable. Although the dry air contains carbon dioxide, the concentration thereof is 0.0390 vol % and extremely low.

As described above, in the first preferred embodiment, the dry air, which is an example of an oxygen-containing gas that contains oxygen gas, is supplied to the TMAH-containing chemical liquid that contains TMAH. The chemical liquid is thereby prepared and supplied to the substrate W. The substrate processing system 1 can thus process the substrate W at a stable etching rate. Further, the substrate processing system 1 can make the processing ability of the TMAH-containing chemical liquid recover by making the oxygen-containing gas dissolve in the TMAH-containing chemical liquid.

Second Preferred Embodiment

Figure 8:
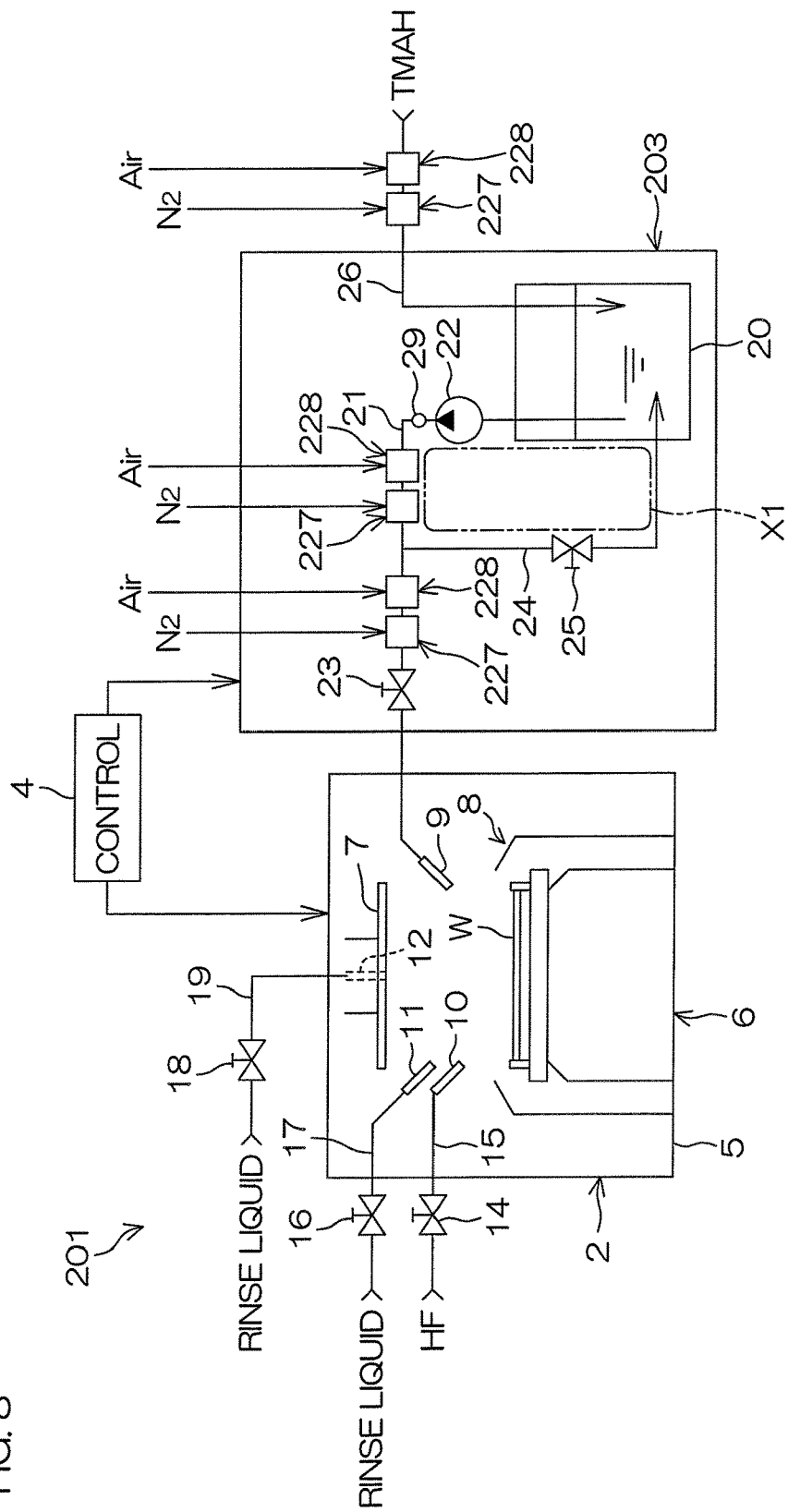
FIG. 8 is a schematic view of a substrate processing system according to a second preferred embodiment of the present invention.
Figure 9A:
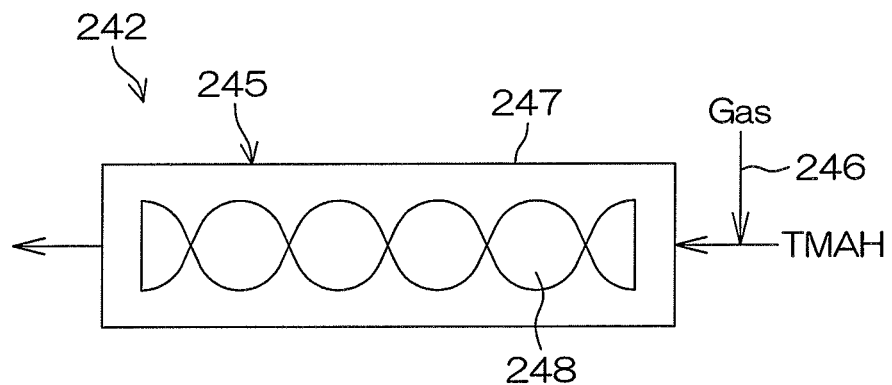
FIG. 9A is a schematic view of a mixing unit.
Figure 9B:
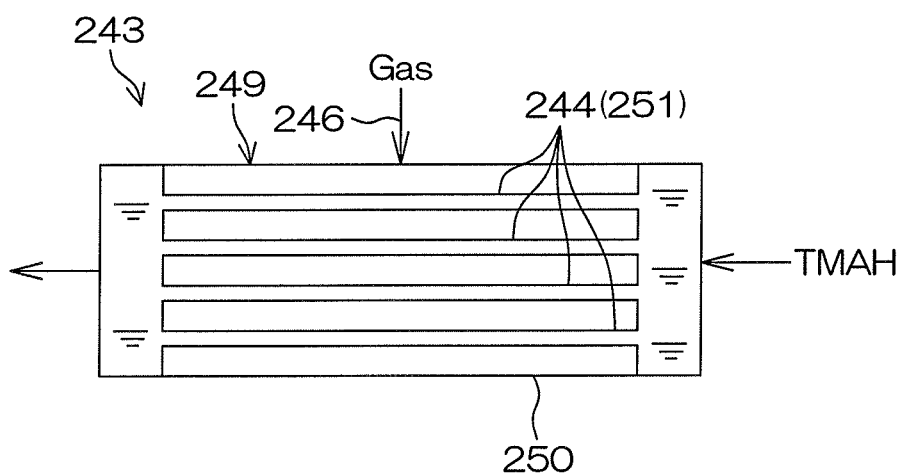
FIG. 9B is a schematic view of a dissolution unit.

A second preferred embodiment of the present invention shall now be described. In FIG. 8 to FIG. 9B below, component portions equivalent to respective portions shown in FIG. 1 to FIG. 7 described above shall be provided with the same reference symbols as those in FIG. 1 and description thereof shall be omitted.

FIG. 8 is a schematic view of a substrate processing system 201 according to the second preferred embodiment of the present invention. FIG. 9A is a schematic view of a mixing unit 242. FIG. 9B is a schematic view of a dissolution unit 243.

As shown in FIG. 8, the substrate processing system 201 includes the processing unit 2 that processes a substrate W using processing liquids, such as a chemical liquid, rinse liquid, etc., a chemical liquid supplying unit 203 supplying TMAH, which is an example of a chemical liquid, to the processing unit 2, and the controller 4 controlling devices and opening and closing of valves included in the substrate processing system 201. As in the first preferred embodiment, the controller 4 controls the chemical liquid supplying unit 203 to supply the TMAH that is adjusted in dissolved oxygen concentration to the processing unit 2.

As shown in FIG. 8, the chemical liquid supplying unit 203 according to the second preferred embodiment has the same arrangement as the chemical liquid supplying unit 3 according to the first preferred embodiment with the exception of the nitrogen dissolution unit and the oxygen dissolution unit. That is, the chemical liquid supplying unit 203 according to the second preferred embodiment includes, in place of the nitrogen dissolution unit 27 and the oxygen dissolution unit 28 according to the first preferred embodiment, a nitrogen dissolution unit 227 increasing a dissolved nitrogen concentration in the TMAH by making nitrogen gas dissolve in the TMAH inside a connection piping (at least one piping among the first chemical liquid piping 21, the circulation piping 24, and the replenishing piping 26) connected to the tank 20, and an oxygen dissolution unit 228 increasing a dissolved oxygen concentration in the TMAH by making oxygen gas dissolve in the TMAH inside a connection piping.

The nitrogen dissolution unit 227 may be interposed in the first chemical liquid piping 21 at a position further upstream (further to the tank 20 side) than a position of connection of the first chemical liquid piping 21 and the circulation piping 24 or may be interposed in the circulation piping 24. That is, the nitrogen dissolution unit 227 may be interposed in the circulation path X1. Or, the nitrogen dissolution unit 227 may be interposed in the first chemical liquid piping 21 at a position further downstream than the position of connection of the first chemical liquid piping 21 and the circulation piping 24 or may be interposed in the replenishing piping 26. That is, the nitrogen dissolution unit 227 may be interposed in a path (non-circulation path) other than the circulation path X1. As with the nitrogen dissolution unit 227, the oxygen dissolution unit 228 may be interposed in any of the first chemical liquid piping 21, the circulation path X1, and the replenishing piping 26. FIG. 8 shows an example where three nitrogen dissolution units 227 are interposed in the first chemical liquid piping 21, the circulation path X1, and the replenishing piping 26, respectively, and three oxygen dissolution units 228 are interposed in the first chemical liquid piping 21, the circulation path X1, and the replenishing piping 26, respectively.

Each nitrogen dissolution unit 227 may be a mixing unit 242 (see FIG. 9A) that mixes the TMAH and the nitrogen gas or may be a dissolution unit 243 (see FIG. 9B) that makes the nitrogen gas dissolve in the TMAH using a semipermeable membrane 244 that allows only the gas to permeate. Similarly, the oxygen dissolution unit 228 may be a mixing unit 242 that mixes the TMAH and the oxygen gas or may be a dissolution unit 243 that makes the oxygen gas dissolve in the TMAH using a semipermeable membrane 244 that allows only the gas to permeate.

As shown in FIG. 9A, the mixing unit 242 includes a static mixer 245 interposed in a connection piping and a gas piping 246 supplying a gas (the nitrogen gas or the dry air) to the static mixer 245. The static mixer 245 includes a pipe 247 interposed in the connection piping and a stirring fin 248 disposed inside the pipe 247 and twisted around an axis extending in a flow through direction of the liquid. The gas piping 246 may be connected to the pipe 247 or may be connected to the connection piping at a further upstream side of the pipe 247. When the TMAH from the connection piping and the gas from the gas piping 246 are supplied into the pipe 247, a mixed fluid of the TMAH and the gas flows along the stirring fin 248. In this process, rotation and disruption of the mixed fluid are repeated and the TMAH and the gas are mixed uniformly inside the pipe 247. The gas thus dissolves in the TMAH and the dissolved nitrogen concentration or dissolved oxygen concentration in the TMAH increases.

As shown in FIG. 9B, the dissolution unit 243 includes a semipermeable membrane unit 249 interposed in a connection piping and the gas piping 246 supplying the gas (the nitrogen gas or the dry air) to the semipermeable membrane unit 249. The semipermeable membrane unit 249 includes a cylindrical housing 250 interposed in the connection piping and a plurality of hollow fiber membranes 251 disposed inside the housing 250. The hollow fiber membranes 251 are cylindrical, fibrous membranes formed of a semipermeable membrane 244 that allows only gas to permeate through. The TMAH supplied from the connection piping to the semipermeable membrane unit 249 passes through interiors of the plurality of hollow fiber membranes 251 and is thereafter discharged from the semipermeable membrane unit 249 to the connection piping. The gas piping 246 is connected to the housing 250. The gas from the gas piping 246 is supplied to the interior of the housing 250 at peripheries of the hollow fiber membranes 251. The interior of the housing 250 is thereby pressurized by the gas and the gas permeates through the hollow fiber membranes 251. The gas thus dissolves in the TMAH inside the hollow fiber membranes 251 and the dissolved nitrogen concentration or dissolved oxygen concentration in the TMAH increases.

Other Preferred Embodiments

Although the first and second preferred embodiments of the present invention have been described above, the present invention is not restricted to the contents of the first and second preferred embodiments and various modifications are possible within the scope of the claims.

Figure 10A:
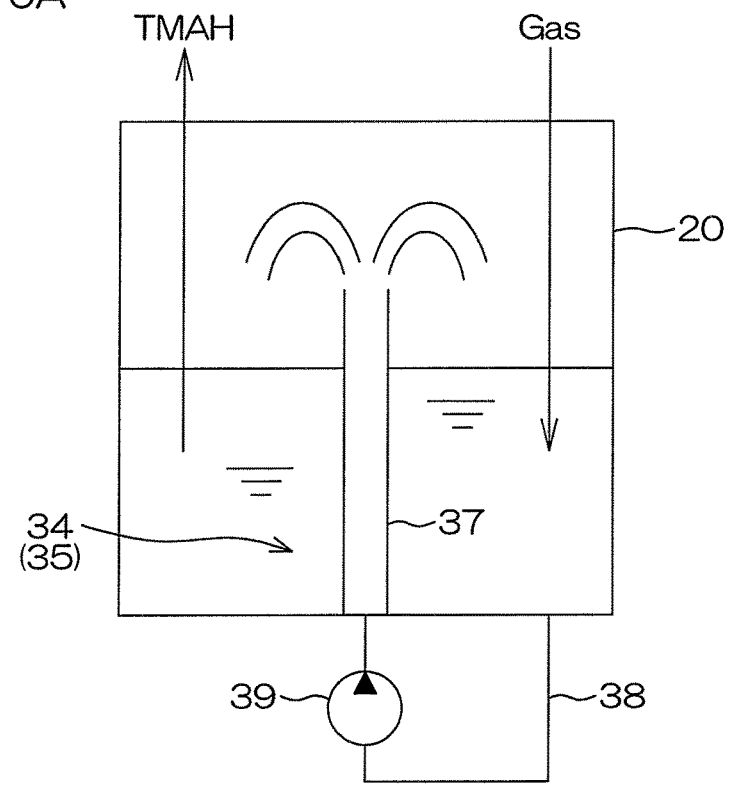
FIG. 10A is a schematic view of an example of an arrangement of a dissolution promoting unit.
Figure 10B:
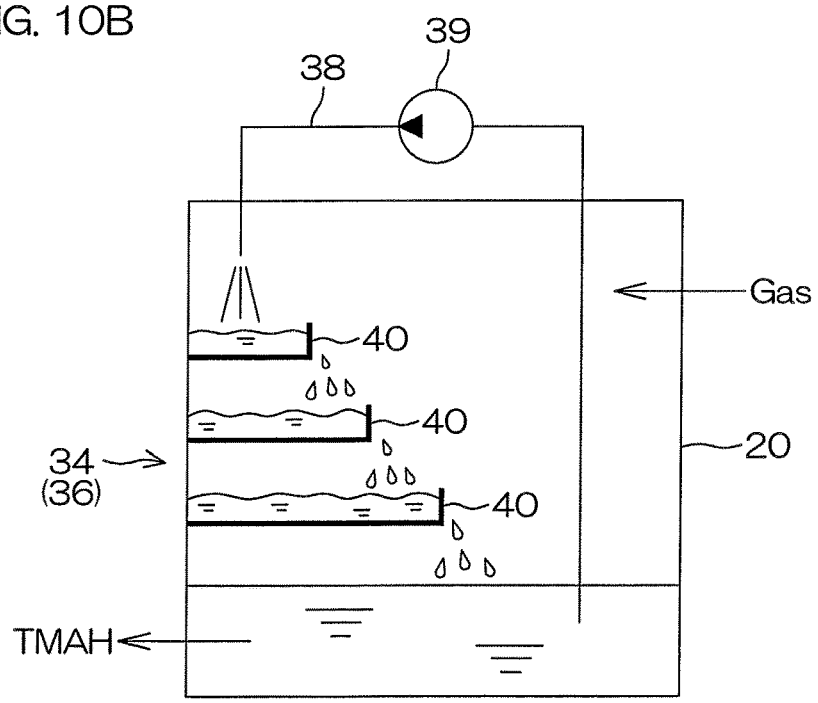
FIG. 10B is a schematic view of another example of an arrangement of a dissolution promoting unit.

For example, the nitrogen dissolution units 27 and 227 may include dissolution promoting units 34, each of which increases a contact time of the TMAH and the nitrogen gas inside the tank 20 to increase the dissolved nitrogen amount in the TMAH, as shown in FIG. 10A and FIG. 10B. Similarly, the oxygen dissolution units 28 and 228 may include the dissolution promoting units 34, each of which increases a contact time of the TMAH and the oxygen gas inside the tank 20 to increase the dissolved gas amount in the TMAH. In these cases, the dissolution promoting unit 34 may include a fountain unit 35 that sprays the TMAH upward inside the tank 20 (see FIG. 10A) or a fin unit 36 (see FIG. 10B) or both the fountain unit 35 and the fin unit 36.

FIG. 10A is a schematic view of an example of an arrangement of the dissolution promoting unit 34. As shown in FIG. 10A, the fountain unit 35 includes a spray nozzle 37 that sprays the TMAH upward inside the tank 20 to move the TMAH above the liquid level, a guide piping 38 guiding the TMAH inside the tank 20 to the spray nozzle 20, and a pump 39 feeding the TMAH inside the tank 20 to the spray nozzle 37 through the guide piping 38.

FIG. 10B is a schematic view of another example of an arrangement of the dissolution promoting unit 34. As shown in FIG. 10B, the fin unit 36 includes one or more stages 40 disposed inside the tank 20, the guide piping 38 guiding the TMAH inside the tank 20 to the stages 40, and the pump 39 feeding the TMAH inside the tank 20 to the stages 40 through the guide piping 38. Each stage 40 may be a plate that is held in a horizontal attitude or a tray that is upwardly open. FIG. 10B shows an example where the fin unit 36 includes a plurality of stages 40 as a plurality of trays. The plurality of stages 40 are maintained at horizontal attitudes across intervals in the up/down direction. The TMAH inside the tank 20 is discharged from the guide piping 38 to the uppermost stage 40. Each of the other stages 40 besides the uppermost stage is disposed at a position onto which the TMAH overflowing from the stage 40 at the upper side drops.

Also, with each of the first and second preferred embodiments, a case where both the nitrogen dissolution unit and the oxygen dissolution unit are provided in the chemical liquid supplying unit was described. However, in a case where supplying of the nitrogen-containing gas to the TMAH-containing chemical liquid is unnecessary, just the oxygen dissolution unit may be provided in the chemical liquid supplying unit.

Also, with each of the first and second preferred embodiments, a case where the dissolved gas sensor is provided in the chemical liquid supplying unit was described. However, in a case where the measurement of the dissolved oxygen concentration in the TMAH-containing chemical liquid is not performed, the dissolved gas sensor does not have to be provided in the chemical liquid supplying unit.

While the present invention has been described in detail by way of the embodiments 3 thereof, it should be understood that these embodiments are merely illustrative of the technical principles of the present invention but not limitative of the invention. The spirit and scope of the present invention are to be limited only by the appended claims.

What is claimed is:

1. A substrate processing method comprising:
   a chemical liquid preparing step of stabilizing or increasing an etching rate of a TMAH-containing chemical liquid that contains TMAH (tetramethylammonium hydroxide) by causing an oxygen-containing gas that contains oxygen gas to dissolve in the TMAH-containing chemical liquid;
   a chemical liquid guiding step of guiding the TMAH-containing chemical liquid prepared in the chemical liquid preparing step by a chemical liquid piping; and
   a substrate etching step of etching a film formed on the substrate by causing a nozzle to discharge the TMAH-containing chemical liquid guided by the chemical liquid piping toward the substrate,
   wherein the substrate etching step is a step of etching a polysilicon film formed on the substrate by causing the nozzle to discharge the TMAH-containing chemical liquid guided by the chemical liquid piping toward the substrate.

2. The substrate processing method according to claim 1; wherein the chemical liquid preparing step includes an oxygen-containing gas guiding step of causing a gas piping to guide the oxygen-containing gas to a tank that stores the TMAH-containing chemical etching liquid.

3. A substrate processing method comprising:
   a chemical liquid preparing step of stabilizing or increasing an etching rate of a TMAH-containing chemical liquid that contains TMAH (tetramethylammonium hydroxide) by causing an oxygen-containing gas that contains oxygen gas to dissolve in the TMAH-containing chemical liquid;
   a chemical liquid guiding step of guiding the TMAH-containing chemical liquid prepared in the chemical liquid preparing step by a chemical liquid piping; and
   a substrate etching step of etching a film formed on the substrate by causing a nozzle to discharge the TMAH-containing chemical liquid guided by the chemical liquid piping toward the substrate, wherein the chemical liquid preparing step includes
a measurement step of measuring a dissolved oxygen concentration in the TMAH-containing chemical liquid;
a nitrogen dissolution step of supplying a nitrogen-containing gas containing nitrogen gas to the TMAH-containing chemical liquid to make the nitrogen-containing gas dissolve in the TMAH-containing chemical liquid when the dissolved oxygen concentration measured in the measurement step is higher than a predetermined concentration; and
an oxygen dissolution step of supplying the oxygen-containing gas to the TMAH-containing chemical liquid to make the oxygen-containing gas dissolve in the TMAH-containing chemical liquid when the dissolved oxygen concentration measured in the measurement step is lower than the predetermined concentration.

* * * * *